United States Patent [19]

Yang et al.

[11] Patent Number: 5,478,678

[45] Date of Patent: Dec. 26, 1995

[54] DOUBLE RIM PHASE SHIFTER MASK

[75] Inventors: Ming-Tzong Yang, Hsin Chu; Hong-Tsz Pan, Chang-hua, both of Taiwan

[73] Assignee: United Microelectronics Corporation, Hsinchu, Taiwan

[21] Appl. No.: 318,426

[22] Filed: Oct. 5, 1994

[51] Int. Cl.⁶ .................................................... G03F 9/00
[52] U.S. Cl. .............................. 430/5; 430/322; 430/324; 430/394
[58] Field of Search ................................. 430/5, 322, 324, 430/394

[56] References Cited

U.S. PATENT DOCUMENTS 5,045,417  9/1991  Okamoto ..................................... 430/5
5,288,569  2/1994  Lin ............................................. 430/5

OTHER PUBLICATIONS

"Lithography's Leading Edge, Part 1: Phase–Shift Technology" Pub. in Semiconductor International, Feb. 1992, pp. 42–47.

Primary Examiner—S. Rosasco
Attorney, Agent, or Firm—George O. Saile; Larry J. Prescott

[57] ABSTRACT

This invention describes the fabrication and use of a double rim phase shifter mask comprised of patterned layers of phase shifting material, partially transmitting material, and opaque material formed on a transparent substrate. Since the partially transmitting material is used as a rim at the pattern edge the light intensity transmitted to the wafer is not limited by the transmitting percentage of the partially transmitting material. The mask is self aligned and is readily manufacturable. Image resolution and depth of focus is improved over other photomasks.

21 Claims, 4 Drawing Sheets

DOUBLE RIM PHASE SHIFTER MASK

BACKGROUND OF THE INVENTION

1. FIELD OF THE INVENTION

The invention relates to the use of a phase shifting mask to improve resolution in the fabrication of sub-micron integrated circuits and more particularly to the fabrication and use of a self aligning double rim phase shifter mask with phase shifting regions, half-tone or partially transmitting regions, opaque regions, and non phase shifting transparent regions.

2. DESCRIPTION OF THE RELATED ART

As optical lithography advances to 0.5 to 0.35 microns and below new technologies are needed to improve the resolution of the imaging lens. Phase-shifting photomasks have been used to improve resolution as well as depth of focus. Phase shifting photomasks are described in a paper "LITHOGRAPHY'S LEADING EDGE, PART 1: PHASE-SHIFT TECHNOLOGY," published in Semiconductor International, February 1992, pages 42–47. The description includes rim type phase shifter in the Table on page 45. This rim type phase shifter uses an opaque material in conjunction with a phase shifting material. Phase shifting photomasks are described in U.S. Pat. No. 5,045,417 to Okamoto.

While improvements have been made in image resolution and depth of field, the linear dimensions used in integrated circuit technology call for even greater improvements in resolution and increased depth of field. This invention uses a double rim type phase shifting mask and uses a partially transmitting material in the mask.

SUMMARY OF THE INVENTION

A principle object of the invention is to provide a phase shift photomask which combines the advantages of rim and half-tone, or partially transmitting, phase shift photomasks to achieve improved image resolution and depth of focus tolerance.

Another object of the invention is to provide a very manufacturable method of fabricating a phase shift photomask combining the advantages of rim and partially transmitting photomasks using a single alignment step with all other alignment steps being self aligning.

These objectives are achieved by means of a double rim phase shifter mask wherein a patterned layer of partially transmitting material is formed on a transparent substrate. A patterned layer of phase shifting material is formed on the patterned layer of partially transmitting material with the edges of the patterned layer of phase shifting material extending beyond the edges of the patterned layer of half tone material. A patterned layer of opaque material is formed on the patterned layer of phase shifting material so that the edges of the patterned layer of half tone material extend beyond the edges of the patterned layer of opaque material.

The double rim phase shifter mask combines a partially transmitting rim with a phase shifting rim at the edge of the opaque pattern of the mask. This combination provides a very sharp image at the pattern edge which achieves improved image resolution and depth of focus tolerance. Since light is transmitted through the partially transmitting material only at the pattern edge, the light power reaching the mask is not significantly reduced by the transmitting percentage of the partially transmitting material. The fabrication of the double rim phase shifter mask uses a number of self aligning steps which improves the manufacturability of the mask. There is only one alignment step in fabrication of the mask, with all other alignment steps self aligning.

The double rim phase shifter mask is used in fabrication of integrated circuit wafers where improved image resolution and depth of focus are needed. Light is projected through the mask and focused on the surface of the integrated circuit wafer. Interference in the light passing through the phase shifting, partially transmitting, opaque, and transparent areas of the mask cause nulls in the intensity of the light at the pattern edges and thereby provides improved image resolution at the surface of the wafer. The partially transmitting material is present as a rim at the pattern edges of the opaque material in the mask and does not significantly reduce the light intensity transmitted through the mask.

DESCRIPTION OF THE PREFERRED EMBODIMENTS

Figure 1:
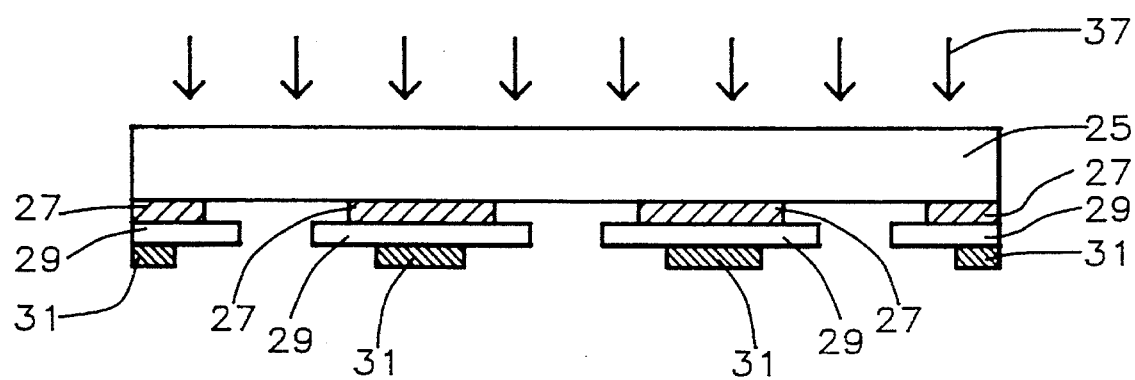
FIG. 1 is a cross sectional view of the double rim phase shifter mask.

Refer now more particularly to FIG. 1 through FIG. 4, there is shown an embodiment of the double rim phase shifter mask. FIG. 1 shows the transparent quartz substrate 25 with a thickness of between about 1 and 5 millimeters. A patterned layer of thin chromium between about 100 and 500 Angstroms thick is formed on the quartz substrate 25. A patterned layer of spin-on-glass 29 with a thickness between about 3800 and 4200 Angstroms is formed on the patterned layer of thin chromium 27 so that the pattern edges of the spin-on-glass 29 extend beyond the pattern edges of the thin chromium 27 by between about 0.25 and 0.5 microns. A patterned layer of chromium 31 with a thickness between about 1000 and 3000 Angstroms is formed on the patterned layer of spin-on-glass 29 so that the pattern edges of the patterned layer of spin-on-glass 29 extend beyond the pattern edges of the patterned layer of chromium 31 by between about 0.5 and 1.0 microns.

Figure 2:
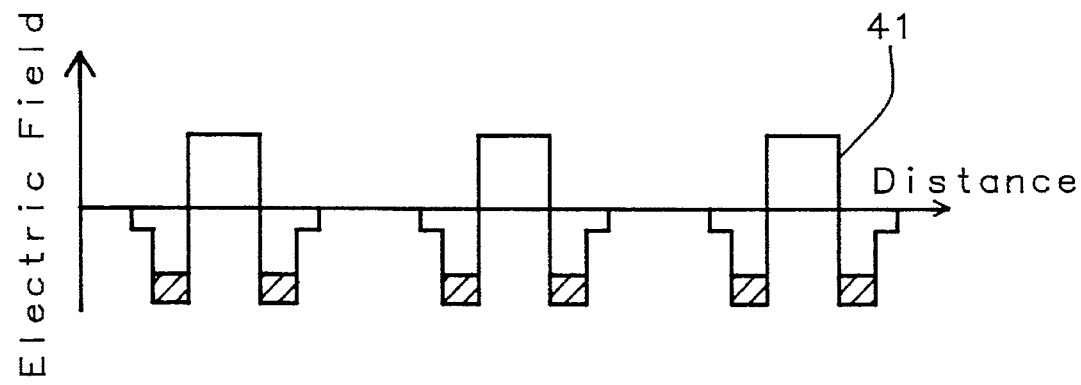
FIG. 2 is a representation of the electric field of the light as it exits the double rim phase shifter mask.
Figure 3:
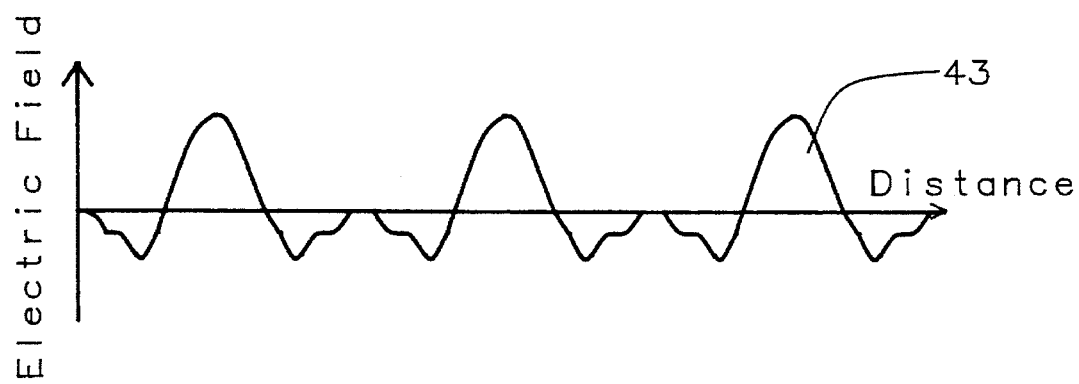
FIG. 3 is a representation of the electric field of the light at the surface of the integrated circuit wafer.
Figure 4:
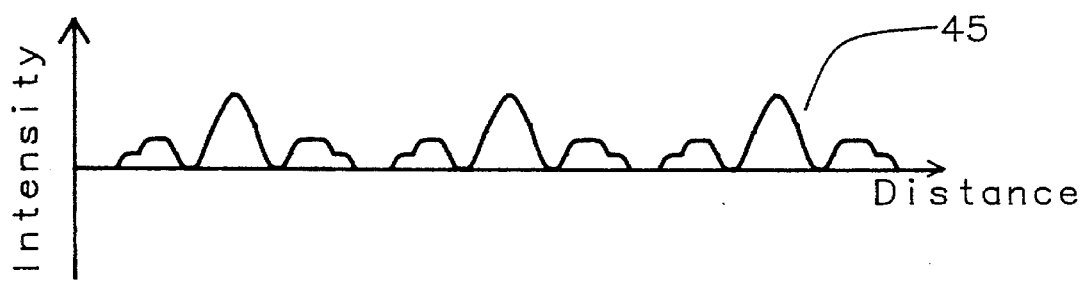
FIG. 4 is a representation of the intensity of the light at the surface of the integrated circuit wafer.

Light 37 passes through the double rim phase shifter mask onto the surface of the integrated circuit wafer. As the light passes through the double rim phase shifter mask it is shifted in phase by some areas of the mask and partially attenuated by some areas of the mask. FIG. 2 shows the electric field 41 of the light as it exits the double rim phase shifter mask. FIG. 3 shows the electric field 43 of the light at the surface of the integrated circuit wafer. FIG. 4 shows the intensity 45 of the light at the surface of the integrated circuit wafer. The image resolution and depth of focus have been improved by 50% over that achieved using other photomasks. The partially transmitting material is used as a rim at the pattern edge so that the light intensity reaching the wafer is not limited by the transmitting percentage of the partially transmitting material.

Figure 5:
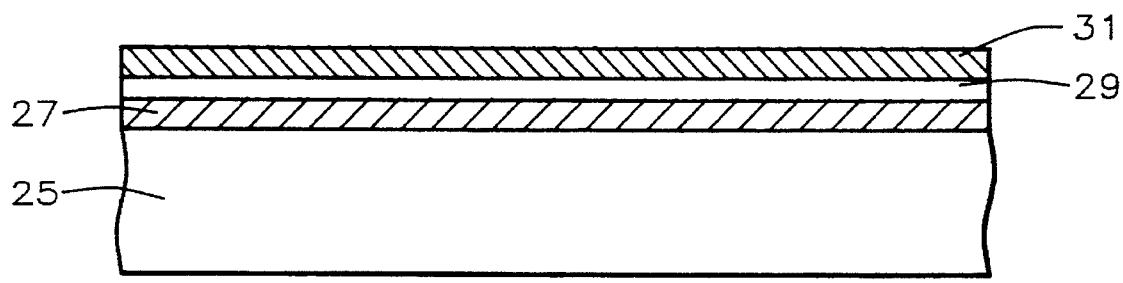
FIG. 5 is a cross sectional view of the layer of opaque material formed on the layer of phase shifter material formed on the layer of partially transmitting material formed on the transparent substrate.

Refer now more particularly to FIG. 5 through FIG. 10, there is shown an embodiment of the method of forming the double rim phase shifter mask. FIG. 5 shows the mask prior the formation of the photoresist layer with a layer of chromium 31 having a thickness of between about 1000 and 3000 Angstroms formed on a layer of spin-on-glass 29 having a thickness of between about 3800 and 4200 Angstroms formed on a layer of thin chromium 27 having a thickness of between about 100 and 500 Angstroms formed on a quartz substrate having a thickness of between about 1 and 5 millimeters.

Figure 6:
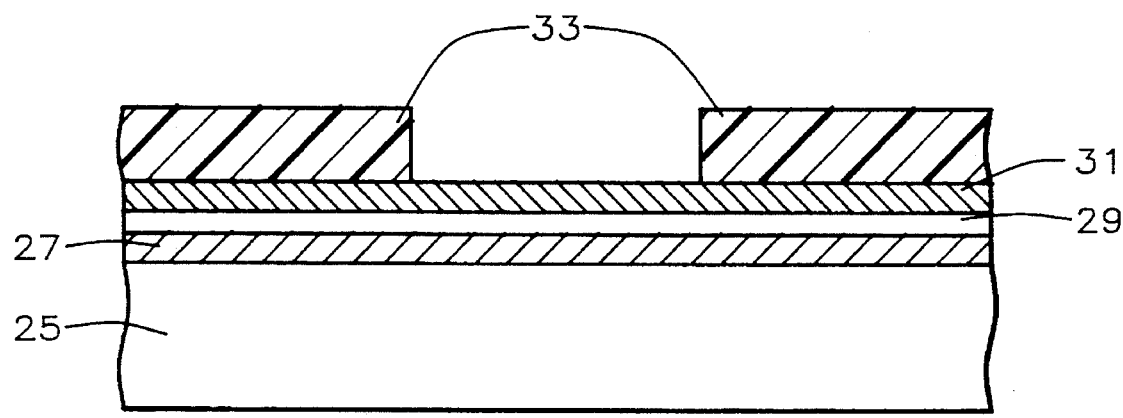
FIG. 6 is a cross sectional view of the exposed and developed layer of photoresist formed on the layer of opaque material.
Figure 7:
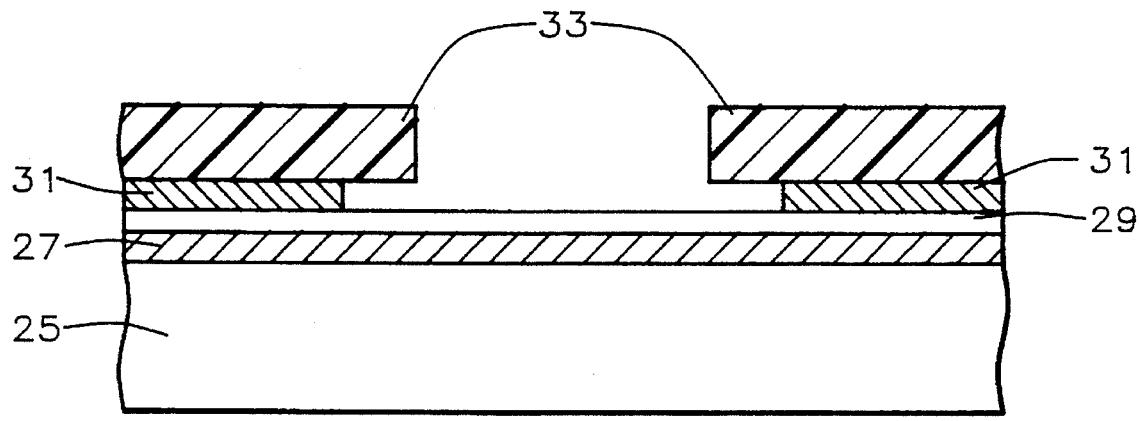
FIG. 7 is a cross sectional view of the double rim phase shifter mask after the pattern has been formed in the layer of opaque material.
Figure 8:
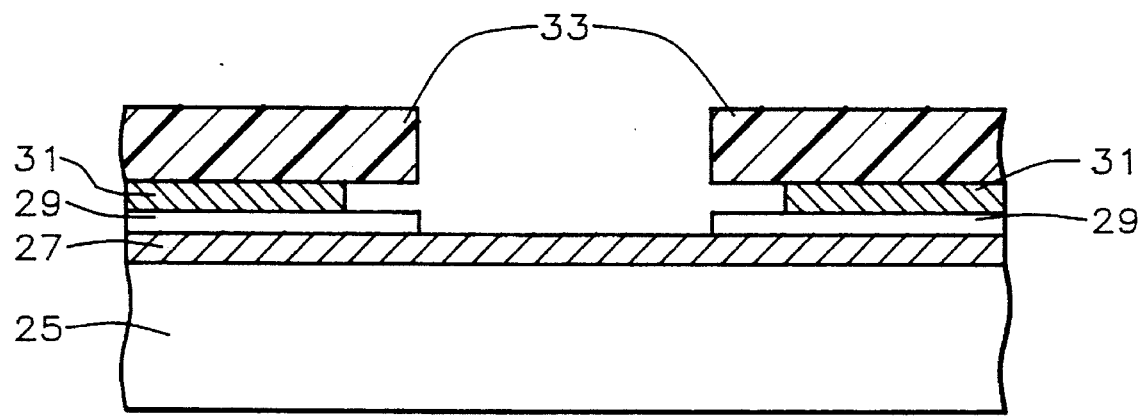
FIG. 8 is a cross sectional view of the double rim phase shifter mask after the pattern has been formed in the layer of phase shifter material.
Figure 9:
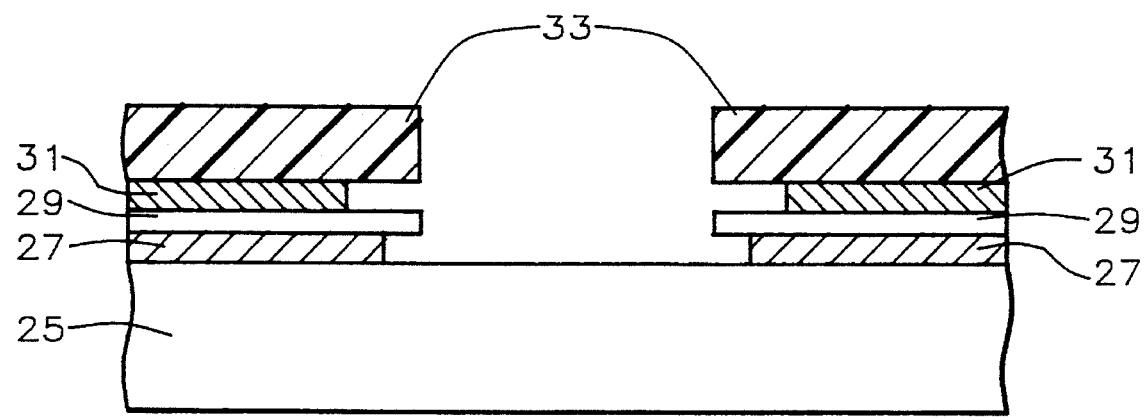
FIG. 9 is a cross sectional view of the double rim phase shifter mask after the pattern has been formed in the layer of partially transmitting material.
Figure 10:
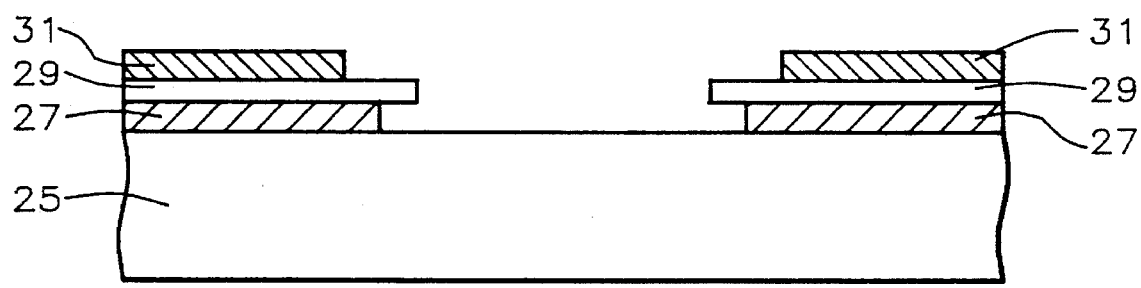
FIG. 10 is a cross sectional view of the completed double rim phase shifter mask.

As shown in FIG. 6 the photoresist layer 33 is then formed on the layer of chromium 31 and exposed and developed. As shown in FIG. 7 the layer of chromium 31 is then over etched isotropically by means of a ceric ammonium and perchloric acid solution through the pattern in the photoresist layer 33 so that the edge of the pattern in the photoresist layer 33 extends beyond the edge of the pattern in the chromium layer 31 by between about 0.25 to 0.5 microns. Next, as shown in FIG. 8, the layer of spin-on-glass 29 is vertically anisotropically etched by means of reactive-ion-etching through the pattern in the photoresist layer 33 so that the edge of the pattern in the photoresist layer 33 is directly over the edge of the pattern in the spin-on-glass layer 29. Next, as shown in FIG. 9, the layer of thin chromium 27 is over etched isotropically by means of a ceric ammonium and perchloric acid solution through the pattern in the photoresist layer 33 so that the edge of the pattern in the photoresist layer 33 extends beyond the edge of the pattern in the layer of thin chromium 27 by between about 0.25 and 0.5 microns. During this etching step the chromium layer 31 on the layer of spin-on-glass is again over-etched so that the edge of the photoresist pattern extends beyond the edge of the pattern in the layer of chromium on the spin-on-glass by between about 0.5 and 1.0 microns. The photoresist layer is then stripped and the double rim phase shifter mask is completed as shown in FIG. 10.

The fabrication of the mask requires only one aligning step, that of exposing the pattern in the photoresist layer. All other alignment steps in the mask formation are self aligning.

While the invention has been particularly shown and described with reference to the preferred embodiments thereof, it will be understood by those skilled in the art that various changes in form and details may be made without departing from the spirit and scope of the invention.

What is claimed is:

1. A double rim phase shifter mask, comprising:

a transparent substrate;

a patterned layer of partially transmitting material having pattern edges formed on said transparent substrate;

a patterned layer of phase shifting material having pattern edges formed on said patterned layer of partially transmitting material wherein said pattern edges of said patterned layer of phase shifting material extend beyond said pattern edges of said patterned layer of partially transmitting material; and a patterned layer of opaque material having pattern edges formed on said patterned layer of phase shifting material wherein said pattern edges of said patterned layer of phase shifting material extend beyond said pattern edges of said patterned layer of opaque material and said pattern edges of said patterned layer of partially transmitting material extend beyond said pattern edges of said patterned layer of opaque material.

2. The double rim phase shifter mask of claim 1 wherein said transparent substrate is quartz with a thickness of between about 1 and 6 millimeters.

3. The double rim phase shifter mask of claim 1 wherein said phase shifter material is spin-on-glass.

4. The double rim phase shifter mask of claim 3 wherein said spin-on-glass has a thickness of between about 3800 and 4200 Angstroms.

5. The double rim phase shifter mask of claim 1 wherein said opaque material is chromium with a thickness of between about 1000 and 3000 Angstroms.

6. The double rim phase shifter mask of claim 1 wherein said partially transmitting material is thin chromium with a thickness of between about 100 and 500 Angstroms.

7. The double rim phase shifter mask of claim 1 wherein said pattern edges of said patterned layer of phase shifting material extend beyond said pattern edges of said patterned layer of partially transmitting material by between about 0.25 and 0.5 microns.

8. The double rim phase shifter mask of claim 1 wherein said pattern edges of said patterned layer of phase shifting material extend beyond said pattern edges of said patterned layer of opaque material by between about 0.5 and 1.0 microns.

9. The double rim phase shifter mask of claim 1 wherein said patterned layer of partially transmitting material, said patterned layer of phase shifting material, and said patterned layer of opaque material are formed using a pattern formed in a single photoresist mask, whereby said patterned layer of partially transmitting material, said patterned layer of phase shifting material, and said patterned layer of opaque material are all aligned to said pattern formed in said single photoresist mask.

10. A method of forming a double rim phase shifter mask, comprising the steps of:

providing a transparent substrate;

forming a layer of partially transmitting material on said transparent substrate;

forming a layer of phase shifting material on said layer of partially transmitting material;

forming a layer of opaque material on said layer of phase shifting material;

forming a layer of photoresist on said layer of opaque material;

forming a photoresist mask by exposing and developing a first pattern having pattern edges in said layer of photoresist;

forming a second pattern having pattern edges in said layer of opaque material by means of isotropically etching said layer of opaque material through said photoresist mask so that said pattern edges of said first pattern in said layer of photoresist extend beyond said pattern edges in said second pattern in said layer of opaque material;

forming a third pattern having pattern edges in said layer of phase shifting material by means of vertically anisotropically etching said layer of phase shifting material through said photoresist mask so that said pattern edges of said first pattern in said layer of photoresist are directly above said pattern edges of said third pattern in said layer of phase shifting material;

forming a fourth pattern having pattern edges by means of isotropically etching said layer of partially transmitting material through said photoresist mask so that said pattern edges of said first pattern in said layer of photoresist extend beyond said pattern edges of said fourth pattern in said layer of partially transmitting material; and stripping said layer of photoresist.

11. The method of claim 10 wherein said transparent substrate is quartz with thickness between about 1 and 6 millimeters.

12. The method of claim 10 wherein said phase shifter material is spin-on-glass.

13. The method of claim 12 wherein said spin-on-glass has a thickness between about 3800 and 4200 Angstroms.

14. The method of claim 12 wherein said spin-on-glass is vertically anisotropically etched using reactive ion etching.

15. The method of claim 10 wherein said opaque material is chromium with thickness between about 1000 and 3000 Angstroms.

16. The method of claim 15 wherein said chromium is isotropically etched using a ceric ammonium and perchloric acid solution.

17. The method of claim 10 wherein said partially transmitting material is thin chromium with a thickness of between about 100 and 500 Angstroms.

18. The method of claim 17 wherein said thin chromium is isotropically etched using a ceric ammonium and perchloric acid solution.

19. The method of claim 10 wherein said pattern edges of said third pattern in said layer of phase shifting material extend beyond said pattern edges of said fourth pattern in said layer of partially transmitting material by between about 0.25 and 0.5 microns.

20. The method of claim 10 wherein said pattern edges of said third pattern in said layer of phase shifting material extend beyond said pattern edges of said second pattern in said layer of opaque material by between about 0.5 and 1.0 microns.

21. The method of claim 10 wherein said second pattern, said third pattern, and said fourth pattern are all aligned to said first pattern in said photoresist mask.

* * * * *